(12) United States Patent
Tanaka et al.

(10) Patent No.: US 9,070,900 B2
(45) Date of Patent: Jun. 30, 2015

(54) METHOD OF MANUFACTURING DISPLAY, AND DISPLAY

(75) Inventors: Hiroshi Tanaka, Kanagawa (JP); Kazuhito Hori, Kanagawa (JP)

(73) Assignee: Joled Inc, Chiyoda-Ku, Tokyo (JP)

( * ) Notice: Subject to any disclaimer, the term of this patent is extended or adjusted under 35 U.S.C. 154(b) by 1095 days.

(21) Appl. No.: 12/617,334

(22) Filed: Nov. 12, 2009

(65) Prior Publication Data

US 2010/0118515 A1 May 13, 2010

(30) Foreign Application Priority Data

Nov. 13, 2008 (JP) ................................. 2008-290941

(51) Int. Cl.
*G09F 13/08* (2006.01)
*H01L 51/52* (2006.01)

(52) U.S. Cl.
CPC ........ *H01L 51/5271* (2013.01); *H01L 51/5237* (2013.01); *H01L 51/5284* (2013.01)

(58) Field of Classification Search
CPC ....... F21V 4/0083; F21V 11/06; F21V 13/10; F21V 13/14; G09G 3/3208; H01L 2251/50; H01L 51/56; H01L 2251/5307; H01L 2251/5361; H01L 2251/56; H01L 51/5284; H01L 51/5237; H01L 51/5271; G02F 1/133605; G02F 1/133603
USPC ............ 362/97.1; 313/504–506, 512; 349/61, 349/62, 69
See application file for complete search history.

(56) References Cited

U.S. PATENT DOCUMENTS

| | | | |
|---|---|---|---|
| 6,354,714 B1 * | 3/2002 | Rhodes ...................... | 362/153.1 |
| 6,869,206 B2 * | 3/2005 | Zimmerman et al. ........ | 362/310 |
| 6,897,474 B2 * | 5/2005 | Brown et al. ................... | 257/40 |
| 7,271,531 B2 * | 9/2007 | Cho et al. ...................... | 313/493 |
| 7,586,666 B2 * | 9/2009 | McCabe et al. ............... | 359/265 |
| 7,636,188 B2 * | 12/2009 | Baur et al. .................... | 359/267 |
| 7,675,229 B2 * | 3/2010 | Yuki ............................. | 313/505 |
| 7,675,585 B2 * | 3/2010 | Kim ................................ | 349/69 |
| 7,825,570 B2 * | 11/2010 | Cok .............................. | 313/116 |
| 7,859,737 B2 * | 12/2010 | McCabe et al. ............... | 359/265 |
| 7,948,172 B2 * | 5/2011 | Cok et al. ...................... | 313/506 |
| 2003/0173897 A1 * | 9/2003 | Iwase et al. ................... | 313/512 |
| 2004/0108980 A1 | 6/2004 | Yonekubo et al. | |
| 2005/0281033 A1 * | 12/2005 | Coushaine et al. ........... | 362/294 |
| 2006/0152931 A1 * | 7/2006 | Holman ........................ | 362/297 |

(Continued)

FOREIGN PATENT DOCUMENTS

| | | |
|---|---|---|
| JP | 2004-164912 | 6/2004 |
| JP | 2005-227519 | 8/2005 |
| JP | 2007-248484 | 9/2007 |

*Primary Examiner* — Mary McManmon
(74) *Attorney, Agent, or Firm* — K&L Gates, LLP

(57) ABSTRACT

A method of manufacturing a display not needing a complicated post-process for forming a reflecting mirror film and allowing degradation in an organic light-emitting device to be prevented, and a display. The method of manufacturing a display includes the steps of: forming a plurality of organic light-emitting devices in a display region on a substrate to form a light-emitting panel; forming projection-shaped reflection elements corresponding to the plurality of organic light-emitting devices, respectively, on a base to form a reflector; forming an adhesive layer along an outer edge of the light-emitting panel; and bonding the light-emitting panel and the reflector together with the adhesive layer in a vacuum atmosphere, thereby to form a vacuum layer in a space between the light-emitting panel and the reflector.

8 Claims, 17 Drawing Sheets

(56) References Cited

U.S. PATENT DOCUMENTS

| | | | |
|---|---|---|---|
| 2007/0019137 A1* | 1/2007 | Kim et al. | 349/114 |
| 2007/0200496 A1* | 8/2007 | Cok et al. | 313/512 |
| 2008/0144182 A1* | 6/2008 | Lubart et al. | 359/622 |
| 2008/0198597 A1* | 8/2008 | Blumel | 362/247 |
| 2008/0253132 A1 | 10/2008 | Urabe et al. | |
| 2010/0157585 A1* | 6/2010 | Diekmann et al. | 362/228 |

\* cited by examiner

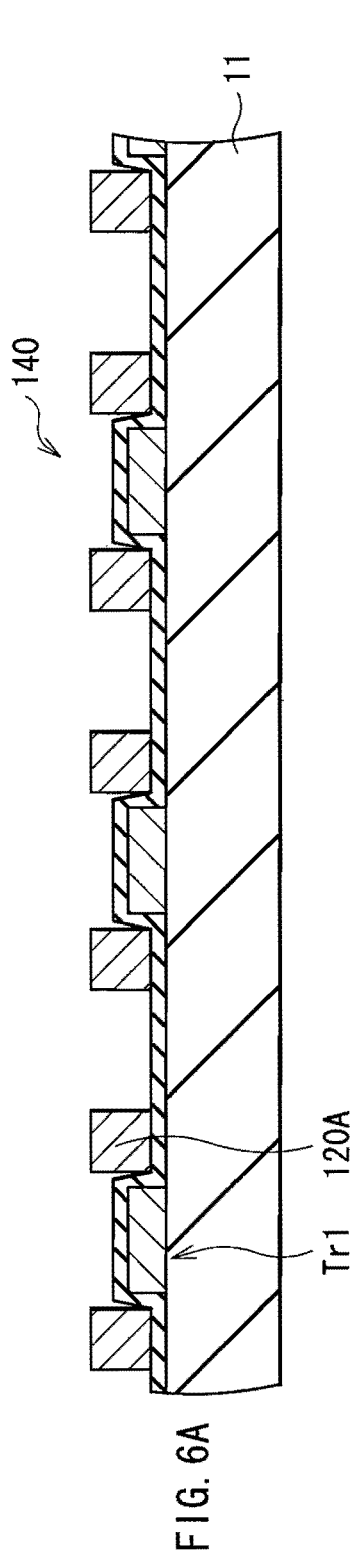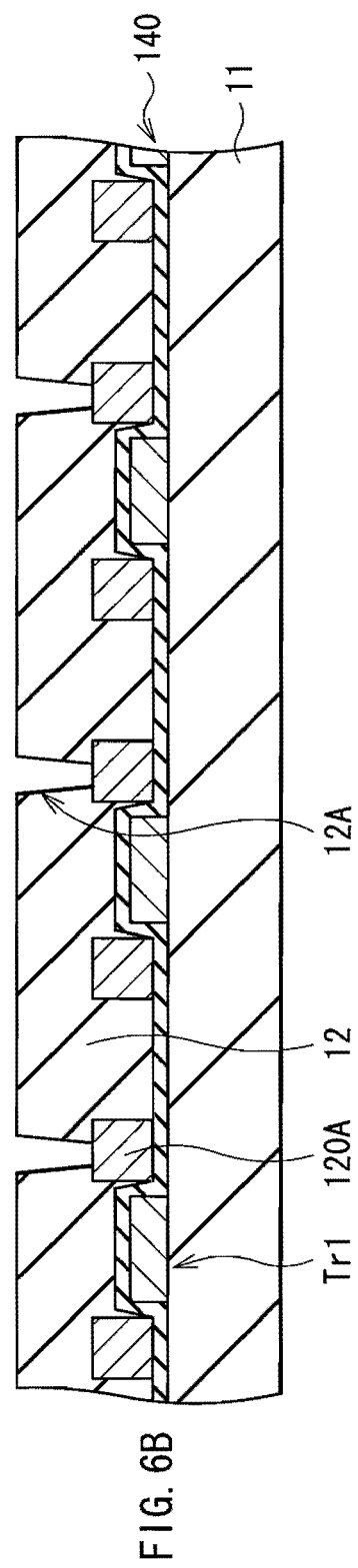

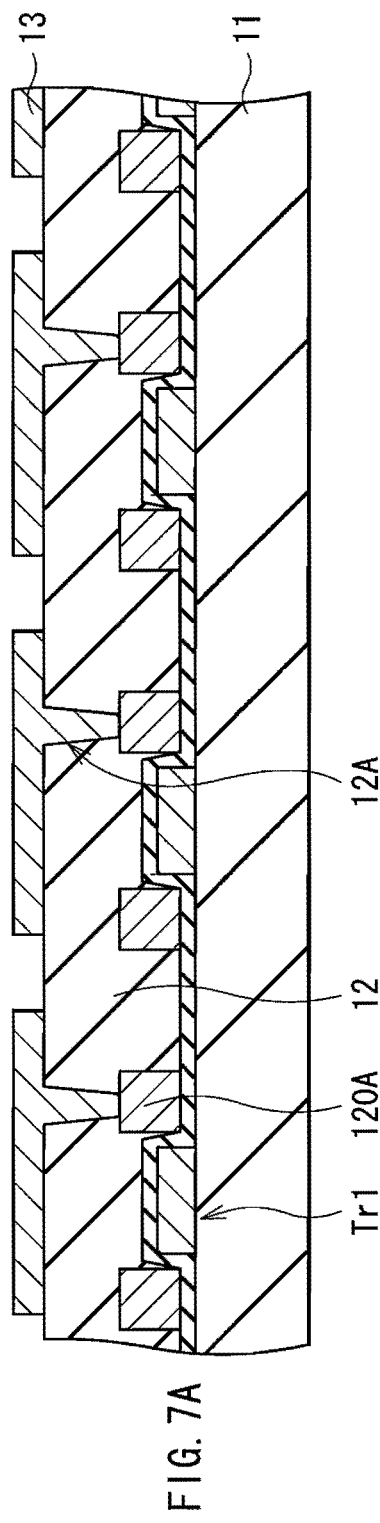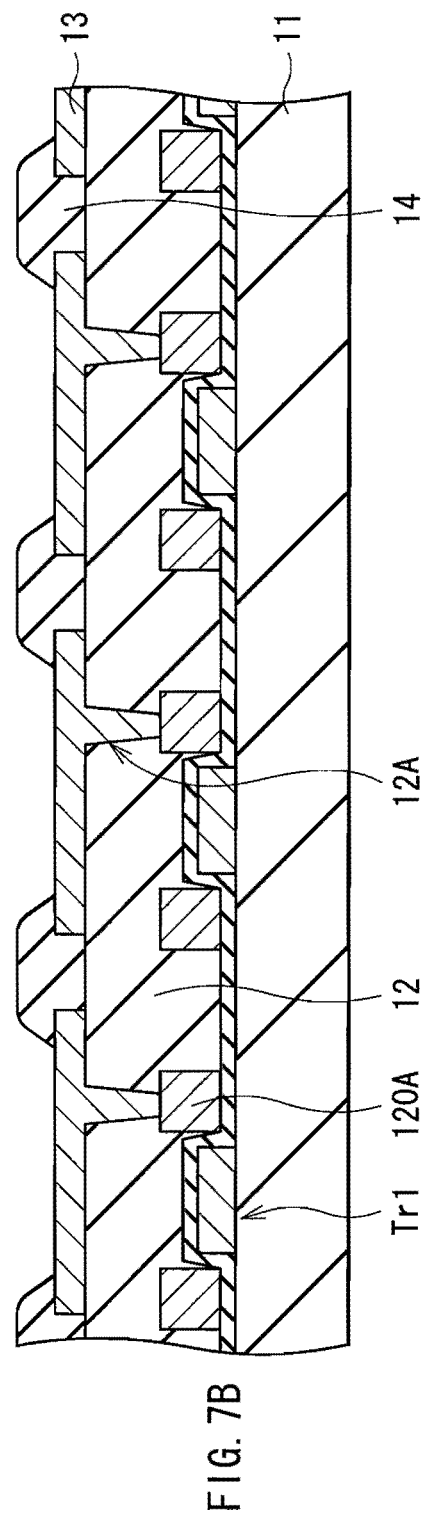

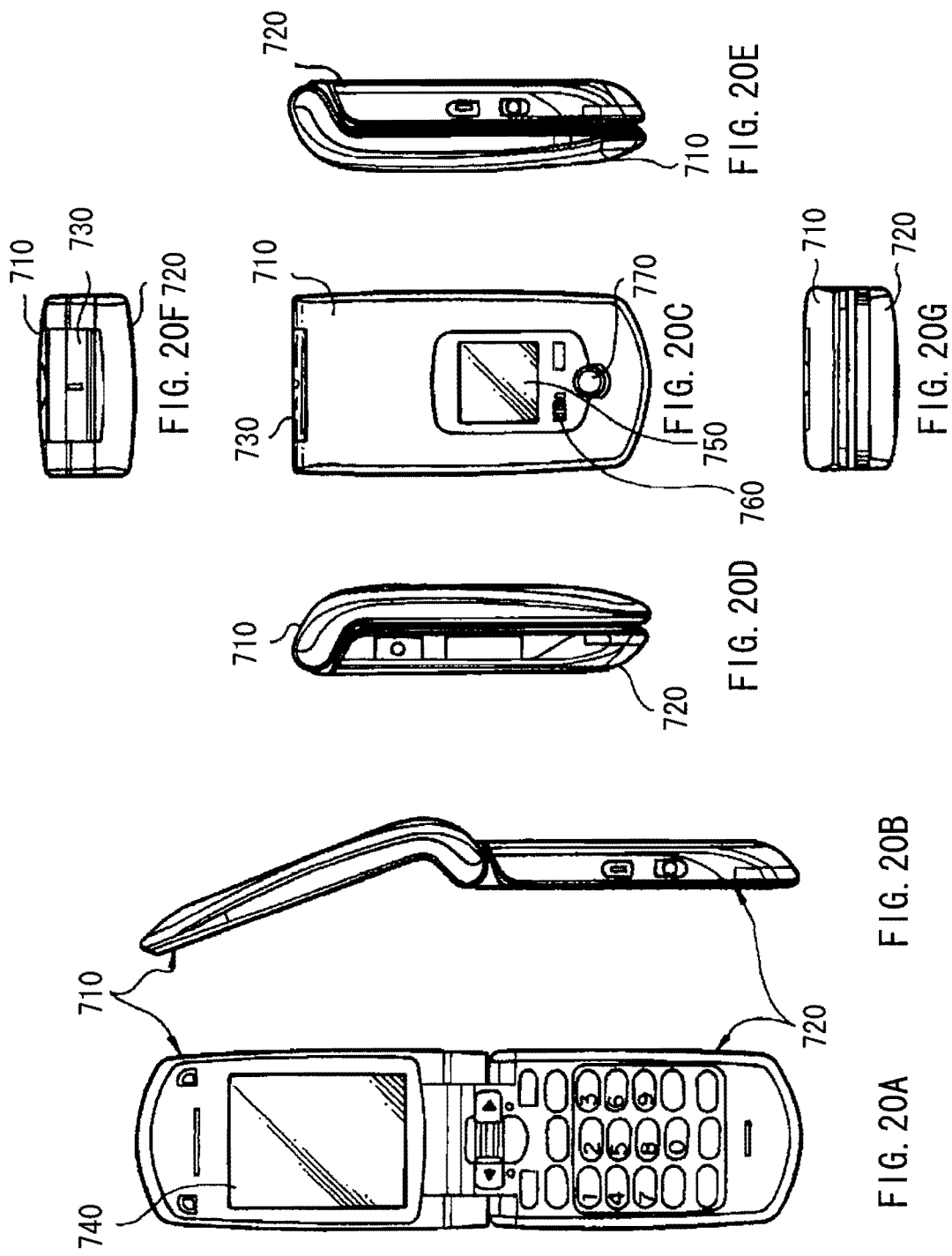

METHOD OF MANUFACTURING DISPLAY, AND DISPLAY

CROSS REFERENCES TO RELATED APPLICATIONS

The present application claims priority to Japanese Priority Patent Application JP 2008-290941 filed in the Japan Patent Office on Nov. 13, 2008, the entire content of which is hereby incorporated by references.

BACKGROUND

The present application relates to a method of manufacturing a display which includes a reflector for improving luminance on a light extraction side of a light-emitting panel using an organic light-emitting device (an organic EL (Electroluminescence) device), and a display. A self-luminous device such as an organic light-emitting device includes a first electrode, a layer including a light-emitting layer and a second electrode in order on a substrate, and when a DC voltage is applied between the first electrode and the second electrode, electron-hole recombination occurs in the light-emitting layer to emit light. The emitted light may be extracted from a side closer to the first electrode and the substrate, or the emitted light may be extracted from a side closer to the second electrode, that is, from a side opposite to a side where a circuit including a TFT (Thin Film Transistor) or wiring is arranged so as to increase an aperture ratio.

An example of a display using a self-luminous device is a display using an organic light-emitting device, for example, as described in Japanese Unexamined Patent Application Publication No. 2005-227519. However, in the display in related art, light emitted from the light-emitting layer is not extracted from the display by total reflection or the like, so the light use efficiency of the display is not so high. Therefore, for example, as described in Japanese Unexamined Patent Application Publication No. 2007-248484, it is proposed that an optical part called a reflector be arranged directly above an organic light-emitting device so as to improve light extraction efficiency. The reflector is formed by arranging a plurality of projection-shaped reflection elements on a base such as glass, and a reflecting mirror film is formed on a side surface of each of the reflection elements.

However, in such a method of manufacturing a reflector in related art, after reflection elements are formed, a post-process for forming a reflecting mirror film on the side surface of each of the reflection elements is necessary. Therefore, in the method of manufacturing a reflector in related art, a film forming step and a polishing step on a large area are necessary, thereby considerable effort is expended, and the film forming step and the polishing step cause an increase in cost and a decline in yields. Moreover, the reflectivity of a reflecting mirror film made of, for example, aluminum (Al) is approximately 90% at maximum, thereby to cause a loss due to absorption.

In addition, Japanese Unexamined Patent Application Publication No. 2004-164912 describes that recesses 24 are arranged in a transmission layer which transmits light outputted from a light-emitting layer, and a side surface 24a of each of the recesses 24 functions as a total reflection surface. The interiors of the recesses 24 are filled with a gas or are in a substantially vacuum state. However, in Japanese Unexamined Patent Application Publication No. 2005-227519, a specific manufacturing method for bringing the interiors of the recesses 24 into a substantially vacuum state is not described. Moreover, in the case where the interiors of the recesses 24 are filled with a gas, the organic light-emitting device is degraded due to the influence of moisture or the like, thereby reliability may be reduced.

Moreover, in Japanese Unexamined Patent Application Publication No. 2004-164912, when a substrate 11 and a transparent member 22 are aligned, and then brought into contact with each other in a decompressed atmosphere, the whole substrate 11 is coated with an adhesive layer 17 by spin coating, so specifically in the case where the substrate is large, it is difficult to uniformly coat the substrate with the adhesive layer.

SUMMARY

It is desirable to provide a method of manufacturing a display not needing a complicated post-process for forming a reflecting mirror film and allows degradation in a light-emitting device to be prevented, and a display.

According to an embodiment, there is provided a method of manufacturing a display including the following steps (A) to (D) of:
  (A) forming a plurality of organic light-emitting devices in a display region on a substrate to form a light-emitting panel;
  (B) forming projection-shaped reflection elements corresponding to the plurality of organic light-emitting devices, respectively, on a base to form a reflector;
  (C) forming an adhesive layer along an outer edge of the light-emitting panel; and
  (D) bonding the light-emitting panel and the reflector together with the adhesive layer in a vacuum atmosphere, thereby to form a vacuum layer in a space between the light-emitting panel and the reflector.

According to an embodiment, there is provided a display including the following components (A) to (D), that is,
  (A) a light-emitting panel including a plurality of organic light-emitting devices in a display region on a substrate;
  (B) a reflector including projection-shaped reflection elements corresponding to the plurality of organic light-emitting devices, respectively on a base;
  (C) an adhesive layer formed along an outer edge of the light-emitting panel so as to bond the light-emitting panel and the reflector together; and
  (D) a vacuum layer formed in a space between the light-emitting panel and the reflector.

In the display according to the embodiment, a space between the light-emitting panel and the reflector is a vacuum layer, so light emitted from the organic light-emitting devices on the light-emitting panel enters each of the reflection elements from a tip surface thereof, and is reflected by an interface between a side surface of each of the reflection elements and the vacuum layer so as to be extracted to outside. Moreover, a possibility that moisture or the like enters from the space between the light-emitting panel and the reflector to the organic light-emitting devices is eliminated, and degradation in the organic light-emitting devices due to the influence of moisture or the like is prevented.

In the method of manufacturing a display according to the embodiment, the adhesive layer is formed along the outer edge of the light-emitting panel, and then the light-emitting panel and the reflector are bonded together with the adhesive layer in a vacuum atmosphere, thereby the vacuum layer is formed in the space between the light-emitting panel and the reflector. Therefore, a complicated post-process for forming a reflecting mirror film is not necessary, and degradation in the organic light-emitting devices is preventable.

In the display according to the embodiment, the vacuum layer is formed in the space between the light-emitting panel and the reflector, so light emitted from the organic light-emitting devices on the light-emitting panel is allowed to be reflected by the interface between the side surface of each of the reflection elements and the vacuum layer. Therefore, a complicated post-process for forming a reflecting mirror film is not necessary, and a possibility that moisture or the like enters from the space between the light-emitting panel and the reflector to the organic light-emitting devices is allowed to be eliminated, and degradation in the organic light-emitting devices due to the influence of moisture or the like is preventable.

Additional features and advantages are described herein, and will be apparent from the following Detailed Description and the figures.

BRIEF DESCRIPTION OF THE FIGURES

FIGS. 6A and 6B are sectional views illustrating a method of manufacturing the display illustrated in FIG. 3 in order of steps.

FIGS. 7A and 7B are sectional views illustrating steps following FIGS. 6A and 6B.

FIGS. 20A to 20G illustrate Application Example 5, FIGS. 20A and 20B are a front view and a side view in a state in which Application Example 5 is opened, respectively, and FIGS. 20C, 20D, 20E, 20F and 20G are a front view, a left side view, a right side view, a top view and a bottom view in a state in which Application Example 5 is closed, respectively.

DETAILED DESCRIPTION

The present application will be described in detail below referring to the accompanying drawings according to an embodiment.

Figure 1:
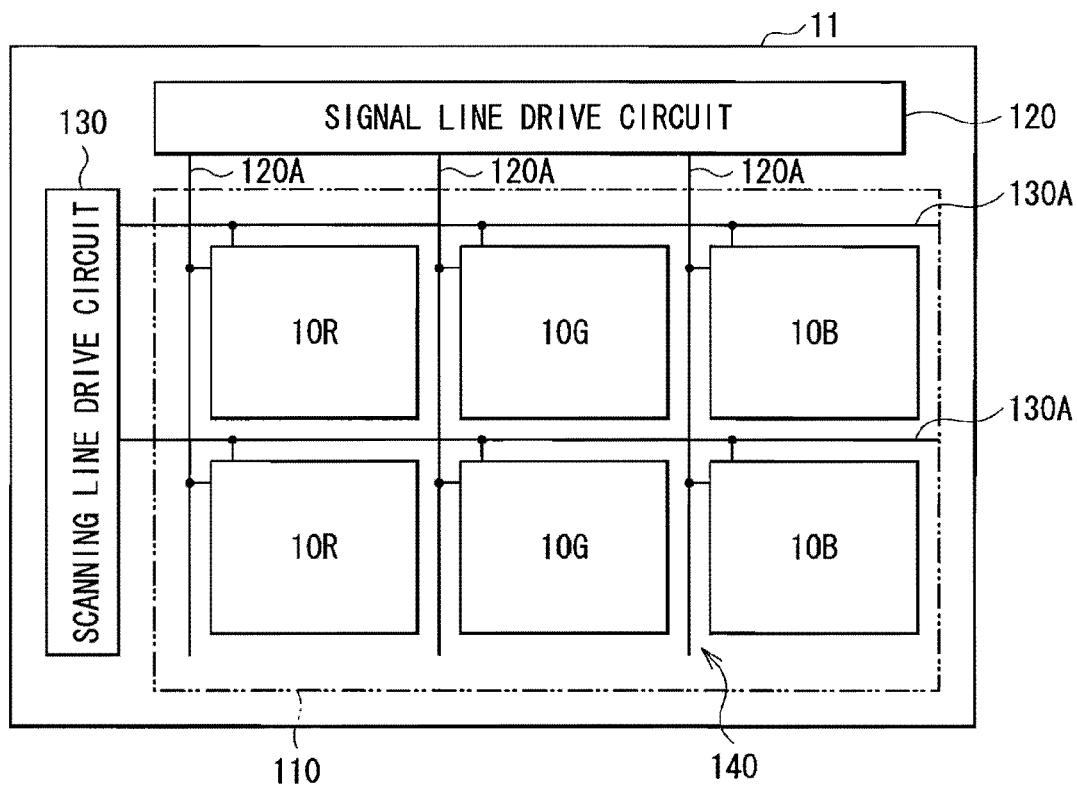
FIG. 1 is an illustration of a configuration of a display according to an embodiment.

FIG. 1 illustrates a configuration of a display according to an embodiment. The display is used as an ultra-thin organic light-emitting color display or the like. For example, the display includes a display region 110 formed by arranging a plurality of organic light-emitting devices 10R, 10G and 10B which will be described later in a matrix form on a drive substrate 11. A signal line drive circuit 120 and a scanning line drive circuit 130 as drivers for picture display are formed around the display region 110.

Figure 2:
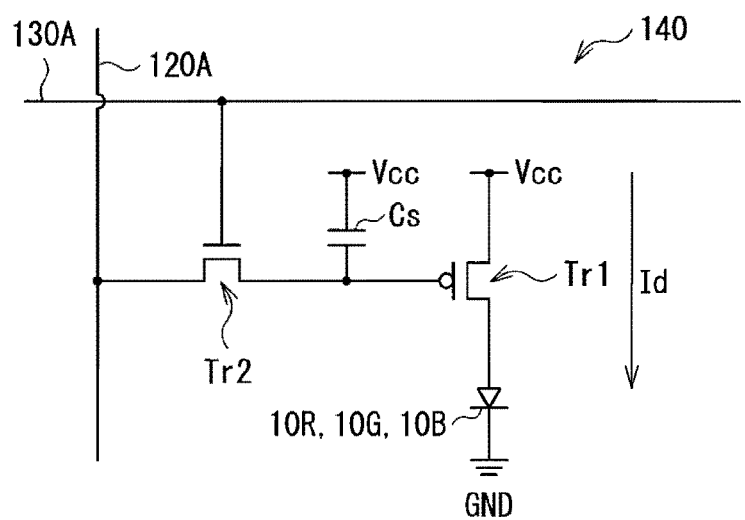
FIG. 2 is an equivalent circuit diagram illustrating an example of a pixel drive circuit illustrated in FIG. 1.

A pixel drive circuit 140 is formed in the display region 110. FIG. 2 illustrates an example of the pixel drive circuit 140. The pixel drive circuit 140 is formed below a first electrode 13 which will be described later, and the pixel drive circuit 140 is an active drive circuit including a driving transistor Tr1 and a writing transistor Tr2, a capacitor (retention capacitor) Cs between the driving transistor Tr1 and the writing transistor Tr2, the organic light-emitting device 10R (or 10G or 10B) connected to the driving transistor Tr1 in series between a first power source line (Vcc) and a second power source line (GND). The driving transistor Tr1 and the writing transistor Tr2 each are composed of a typical thin film transistor (TFT), and the TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a sub-pixel) of the organic light-emitting devices 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

Figure 3:
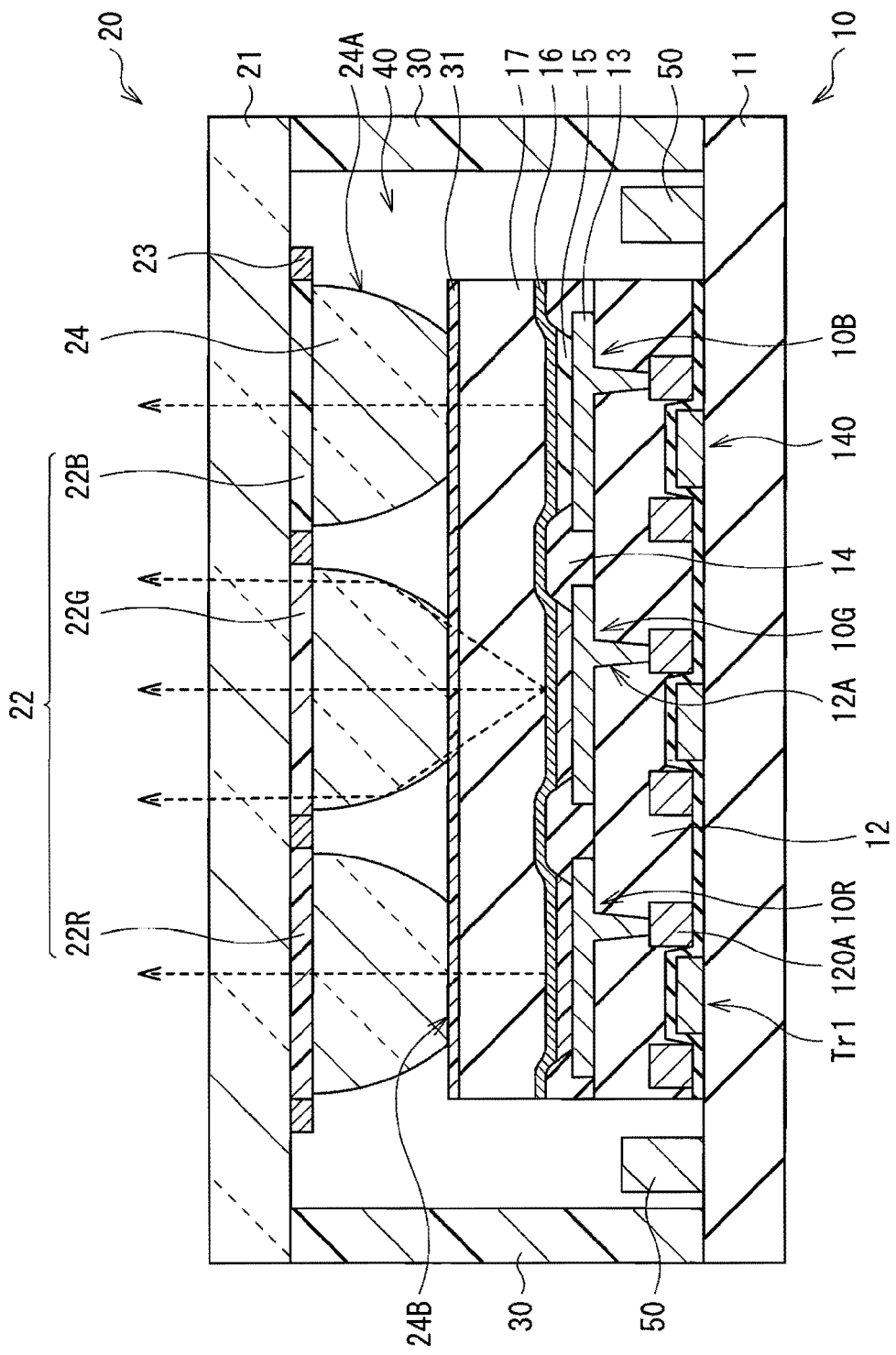
FIG. 3 is a sectional view illustrating a configuration in a display region of the display illustrated in FIG. 1.

FIG. 3 illustrates a sectional view in the display region 110 of the display illustrated in FIG. 1. The display includes a reflector 20 on a light extraction side of a light-emitting panel 10. The light-emitting panel 10 and the reflector 20 are bonded together with an adhesive layer 30 which is formed along an outer edge of the light-emitting panel 10, and a space between the light-emitting panel 10 and the reflector 20 is a vacuum layer 40. Thereby, in the display, a complicated post-process for forming a reflecting mirror film in the reflector 20 is not necessary, and degradation in the organic light-emitting devices 10R, 10G and 10B is preventable.

The light-emitting panel 10 is formed by forming the organic light-emitting devices 10R emitting red light, the organic light-emitting devices 10G emitting green light and the organic light-emitting devices 10B emitting blue light in order in a matrix form as a whole on the drive substrate 11 made of glass, a silicon (Si) wafer, a resin or the like. In addition, the organic light-emitting devices 10R, 10G and 10B each have a rectangular planar shape, and a combination of one organic light-emitting device 10R, one organic light-emitting device 10G and one organic light-emitting device 10B which are adjacent to one another constitutes one pixel.

The organic light-emitting devices 10R, 10G and 10B each have a configuration in which the first electrode 13 as an anode, an insulating film 14, an organic layer 15 including a light-emitting layer which will be described later, and a second electrode 16 as a cathode are laminated in this order on the drive substrate 11 with the above-described pixel drive circuit 140 and a planarization layer 12 in between, and if necessary, the organic light-emitting devices 10R, 10G and 10B are covered with a protective film 17.

The first electrodes 13 are formed so as to correspond to the organic light-emitting devices 10R, 10G and 10B, respectively, and are electrically separated from one another by the insulating film 14. Moreover, the first electrodes 13 have a function as reflective electrodes reflecting light emitted from the light-emitting layer, and it is desirable that the first electrodes 13 have as high reflectivity as possible so as to improve light emission efficiency. The first electrodes 13 each have, for example, a thickness of 100 nm to 1000 nm both inclusive, and are made of aluminum (Al) or an alloy including aluminum (Al), or silver (Ag) or an alloy including silver (Ag). Moreover, the first electrodes 13 may be made of a simple substance or an alloy of any other metal element such as chromium (Cr), titanium (Ti), iron (Fe), cobalt (Co), nickel (Ni), molybdenum (Mo), copper (Cu), tantalum (Ta), tungsten (W), platinum (Pt) or gold (Au).

The insulating film 14 is provided to secure insulation between the first electrodes 13 and the second electrode 16 and to accurately have a desired shape of a light emission region, and is made of, for example, an organic material such as photosensitive acrylic, polyimide or polybenzoxazole or an inorganic insulating material such as silicon oxide (SiO2). The insulating film 14 has openings corresponding to light emission regions of the first electrodes 13. The organic layer 15 and the second electrode 16 may be continuously arranged on not only the light emission regions but also on the insulating film 14, but light is emitted only from the openings of the insulating film 14.

The organic layer 15 has, for example, a configuration in which a hole injection layer, a hole transport layer, a light-emitting layer and an electron transport layer are laminated in order from the first electrode 13 side, but any of these layers except for the light-emitting layer may be arranged if necessary. Moreover, the organic layer 15 may have a different configuration depending on the color of light emitted from the organic light-emitting devices 10R, 10G or 10B. The hole injection layer is provided to enhance hole injection efficiency, and is a buffer layer for preventing leakage. The hole transport layer is provided to enhance the hole transport efficiency to the light-emitting layer. The light-emitting layer emits light by the recombination of electrons and holes in response to the application of an electric field. The electron transport layer is provided to enhance electron transport efficiency to the light-emitting layer. In addition, an electron injection layer (not illustrated) made of LiF, Li2O or the like may be arranged between the electron transport layer and the second electrode 16.

In the organic light-emitting device 10R, examples of the material of the hole injection layer include 4,4'4"-tris(3-methylphenylphenylamino)triphenylamine (m-MTDATA) and 4,4'4"-tris(2-naphthylphenylamino)triphenylamine (2-TNATA), and an example of the material of the hole transport layer is bis[(N-naphthyl)-N-phenyl] benzidine (α-NPD). Moreover, in the organic light-emitting device 10R, an example of the material of the light-emitting layer is an 8-quinolinol aluminum complex (Alq3) mixed with 40 vol % of 2,6-bis[4-[N-(4-methoxyphenyl)-N-phenyl] aminostyryl] naphthalene-1,5-dicarbonitrile (BSN-BCN), and an example of the material of the electron transport layer is Alq3.

In the organic light-emitting device 10G, examples of the material of the hole injection layer include m-MTDATA and 2-TNATA, and an example of the material of the hole transport layer is α-NPD. Moreover, in the organic light-emitting device 10G, an example of the material of the light-emitting layer is Alq3 mixed with 3 vol % of Coumarin6, and an example of the material of the electron transport layer is Alq3.

In the organic light-emitting device 10B, examples of the material of the hole injection layer include m-MTDATA and 2-TNATA, and an example of the material of the hole transport layer is α-NPD. Moreover, in the organic light-emitting device 10B, an example of the material of the light-emitting layer is spiro6φ, and an example of the material of the electron transport layer is Alq3.

The second electrode 16 has, for example, a thickness of 5 nm to 50 nm both inclusive, and is made of a simple substance or an alloy of a metal element such as aluminum (Al), magnesium (Mg), calcium (Ca) or sodium (Na). Among them, the second electrode 16 is preferably made of an alloy of magnesium and silver (a MgAg alloy) or an alloy of aluminum (Al) and lithium (Li) (an AlLi alloy). Moreover, the second electrode 16 may be made of ITO (indium-tin complex oxide) or IZO (indium-zinc complex oxide).

The protective film 17 has, for example, a thickness of 500 nm to 10000 nm both inclusive, and is made of silicon oxide (SiO2), silicon nitride (SiN) or the like.

Figure 4:
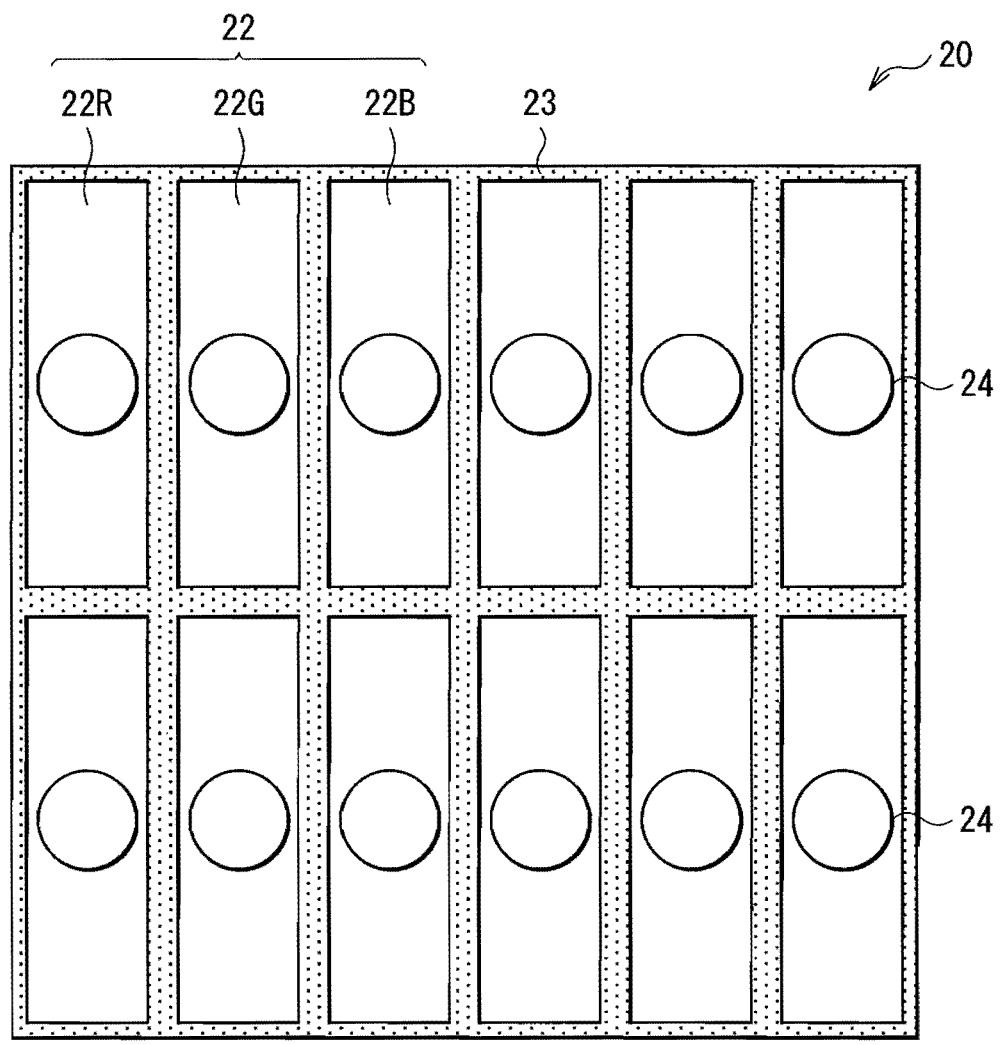
FIG. 4 is a plan view illustrating a configuration of a reflector illustrated in FIG. 3 when viewed from a reflection element side.

FIG. 4 illustrates a plan view of the reflector 20. The reflector 20 is provided to enhance light extraction efficiency from the organic light-emitting devices 10R, 10G and 10B, thereby to improve luminance, and the reflector 20 is arranged on the light extraction side, that is, the second electrode 16 side of the light-emitting panel 10. The reflector 20 has a configuration in which a color filter 22 and a light-shielding film 23 as a black matrix are formed on a surface of a transparent base 21, and reflection elements 24 are arranged on the color filter 22.

The base 21 is made of, for example, glass, a resin substrate or a resin film made of a heat resistant resin, or fused quartz.

The color filter 22 and the light-shielding film 23 are provided to extract light emitted from the organic light-emitting devices 10R, 10G and 10B, and to absorb outside light reflected by the organic light-emitting devices 10R, 10G and 10B and wiring between them, thereby to improve contrast.

The color filter 22 is formed below the reflection elements 24, and includes a red filter 22R, a green filter 22G and a blue filter 22B which are arranged so as to correspond the organic light-emitting devices 10R, 10G and 10B, respectively. The red filter 22R, the green filter 22G and the blue filter 22B each have, for example, a rectangular shape, and are closely formed. The red filter 22R, the green filter 22G and the blue filter 22B each are made of a resin mixed with a pigment, and are adjusted by selecting a pigment so that light transmittance in a target red, green or blue wavelength region is high and light transmittance in other wavelength regions is low.

The light-shielding film 23 is arranged along boundaries of the red filter 22R, the green filter 22G and the blue filter 22B. The light-shielding film 23 is made of, for example, one or more black resin films which are mixed with a black colorant and have an optical density of 1 or over, or a thin film filter using interference of a thin film. Among them, the light-shielding film 23 is preferably made of a black resin film, because the light-shielding film 23 is easily formed at low cost. The thin film filter is made of a laminate including one or more layers of thin films of, for example, a metal, a metal nitride or a metal oxide so as to attenuate light through the use of the interference of the thin films. More specifically, as the thin film filter, a laminate formed by alternately laminating layers of chromium and layers of chromium oxide (III) (Cr2O3) is used. In addition, the light-shielding film 23 is not necessarily arranged.

The reflection elements 24 each have, for example, the shape of a frustum of a cone, and a bottom surface of each reflection element 24 is in contact with the color filter 22, and a top surface of each reflection element 24 is flat, and the area of the top surface is smaller than that of the bottom surface. The reflection elements 24 are made of a resin such as an ultraviolet curable resin or a thermosetting resin, but the reflection elements 24 may be made of low-melting glass.

The reflector 20 reflects light emitted from the organic light-emitting devices 10R, 10G and 10B by an interface between a side surface 24A of each reflection element 24 and the vacuum layer 40. Thereby, in the display, an absorption loss caused by a reflecting mirror film made of a metal or the like in related art is preventable, and a further improvement in light extraction efficiency is allowed.

The side surface 24A of each reflection element 24 may have, for example, a linearly tapered sectional shape, or a curved surface shape allowed to be approximated by an aspheric polynomial. In particular, the side surface 24A preferably has a curved surface shape allowed to be approximated by an aspheric polynomial, because both of light incident upon a lower part of each reflection element 24 and light incident upon an upper part of each reflection element 24 easily satisfy total reflection conditions, thereby the side surface 24A with such a curved surface is advantageous when light is guided to the base 21 side. In the case where the side surface 24A has a linearly tapered sectional shape, it is difficult for light incident upon the lower part of each reflection element 24 to satisfy the total reflection conditions, but compared to the case where the reflector 20 is not provided, light extraction efficiency is allowed to be improved sufficiently as a whole.

The adhesive layer 30 illustrated in FIG. 3 is made of, for example, a thermosetting resin or an ultraviolet curable resin. In addition, a fixing layer 31 for fixing the reflection elements 24 to the light-emitting panel 10 is preferably arranged between the protective film 17 of the light-emitting panel 10 and tip surfaces 24B of the reflection elements 24. The fixing layer 31 is made of, for example, a heat-sensitive adhesive sheet or a potting material. In addition, as a method of bonding the fixing layer 31, thermal adhesion is not necessarily used, and the shape of the fixing layer 31 is not limited to a sheet shape.

Figure 5:
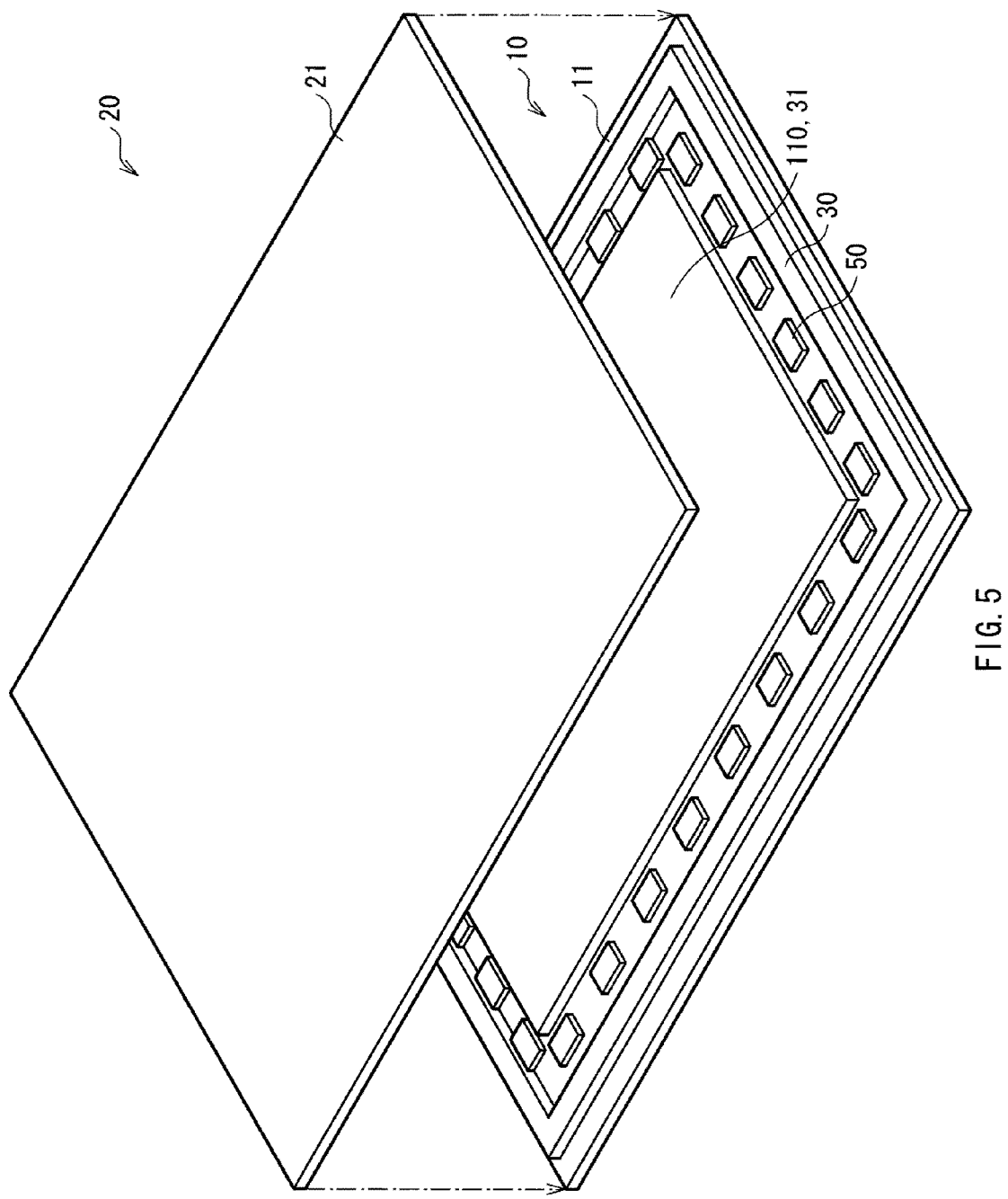
FIG. 5 is an exploded perspective view illustrating the display illustrated in FIG. 3.

Getters 50 with a sheet form, a paste form or the like are arranged between the display region 110 of the light-emitting panel 10 and the adhesive layer 30. The positions where the getters 50 are arranged or the number of getters 50 are not specifically limited, but, for example, as illustrated in FIG. 5, the getters 50 are preferably arranged around the display region 110. As such getters 50, a moisture getter for organic light-emitting device, more specifically "DryFlex (registered trademark)" or "GDO (getter dryer)" (CaO powder) of SAES Getters is applicable. In addition, as the getters 50, a sintered high-porosity non-evaporable getter used for a package of an MEMS device or a flat panel display, more specifically an HPTF getter which is a mixture of titanium and a Zr—V—Fe getter alloy, or zirconium with a purity of 90% or more which is hydrogenated and pulverized may be applicable.

For example, the display is manufactured by the following steps.

FIGS. 6A and 6B to FIG. 13 illustrate a method of manufacturing the display in order of steps. First, as illustrated in FIG. 6A, the pixel drive circuit 140 is formed on the drive substrate 11 made of the above-described material.

Next, as illustrated in FIG. 6B, the whole surface of the drive substrate 11 is coated with the planarization layer 12 made of, for example, a photosensitive polyimide by, for example, a spin coating method, and the planarization layer 12 is patterned into a predetermined shape by exposure to light and development, and connection holes 12A are formed, and then the planarization layer 12 is fired.

Next, as illustrated in FIG. 7A, the first electrodes 13 made of, for example, the above-described material with the above-described thickness is formed on the planarization layer 12 by, for example, a sputtering method, and then the first electrodes 13 are patterned into a predetermined shape by, for example, a lithography technique and etching. Thereby, a plurality of first electrodes 13 are formed on the planarization layer 12.

After that, as illustrated in FIG. 7B, the whole surface of the drive substrate 11 is coated with a photosensitive resin, and openings are formed in the photosensitive resin by exposure to light and development, and then the photosensitive resin is fired to form the insulating film 14.

Figure 8A:
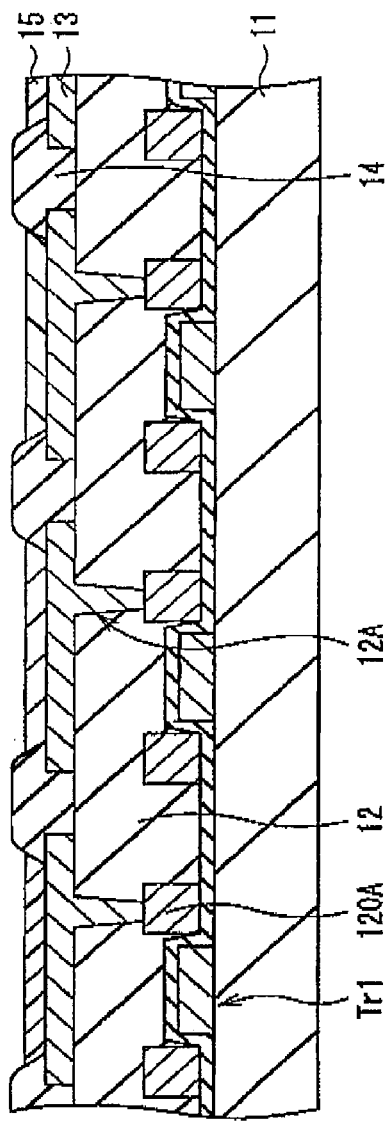
FIGS. 8A and 8B are sectional views illustrating steps following FIGS. 7A and 7B.

Next, as illustrated in FIG. 8A, the hole injection layer, the hole transport layer, the light-emitting layer and the electron transport layer made of the organic light-emitting device 10R of the above-described materials are formed in order so as to form the organic layer 15 of the organic light-emitting device 10R. After that, also as illustrated in FIG. 8A, as in the case of the organic layer 15 of the organic light-emitting device 10R, the hole injection layer, the hole transport layer, the light-emitting layer and the electron transport layer of the organic light-emitting device 10G made of the above-described materials are formed in order to form the organic layer 15 of the organic light-emitting device 10G. Next, also as illustrated in FIG. 8A, as in the case of the organic layer 15 of the organic light-emitting device 10R, the hole injection layer, the hole transport layer, the light-emitting layer and the electron transport layer of the organic light-emitting device 10B made of the above-described materials are formed in order to form the organic layer 15 of the organic light-emitting device 10B.

Figure 8B:
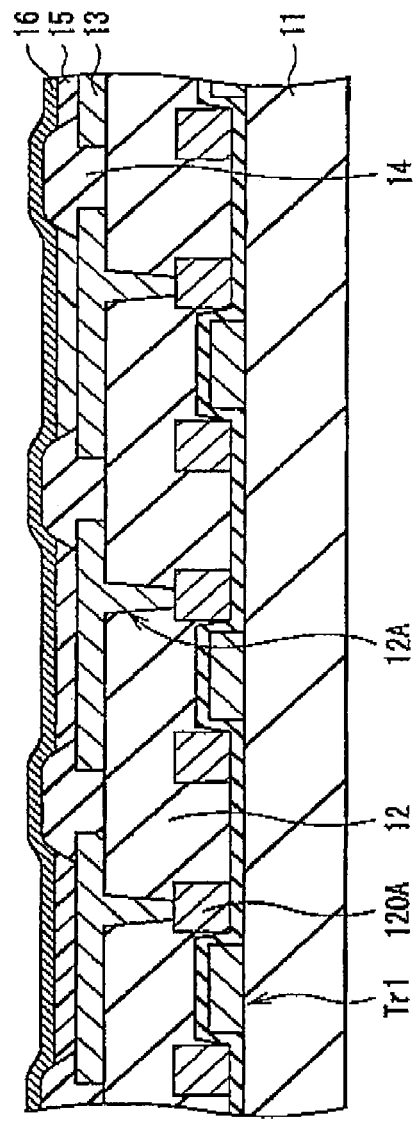

After the organic layers 15 of the organic light-emitting devices 10R, 10G and 10B are formed, as illustrated in FIG. 8B, the second electrode 16 made of the above-described material with the above-described thickness is formed on the whole surface of the drive substrate 11 by, for example, an evaporation method. Thereby, the organic light-emitting devices 10R, 10G and 10B illustrated in FIG. 3 are formed.

Figure 9:
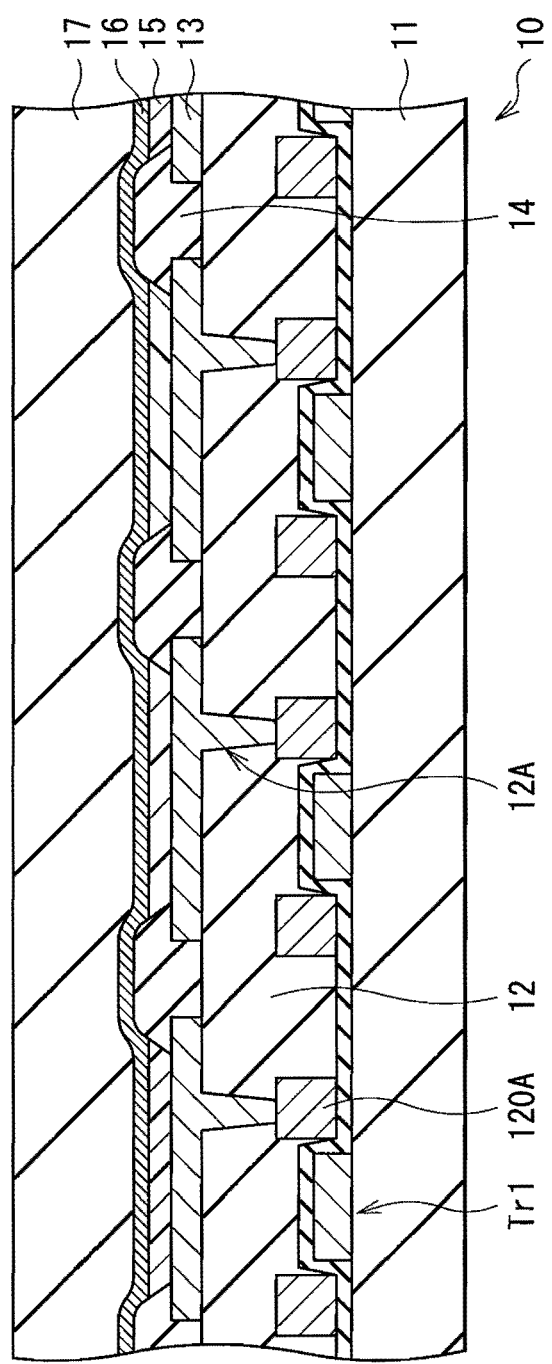
FIG. 9 is a sectional view illustrating a step following FIGS. 8A and 8B.

Next, as illustrated in FIG. 9, the protective film 17 made of the above-described material with the above-described thickness is formed on the second electrode 16. Thereby, the light-emitting panel 10 illustrated in FIG. 3 is formed.

Figure 10A:
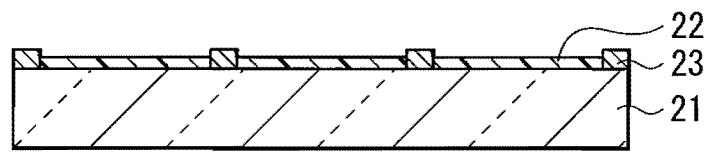
FIGS. 10A to 10D are sectional views illustrating steps following FIG. 9.

Moreover, the reflector 20 is formed. First, as illustrated in FIG. 10A, the light-shielding film 23 made of the above-described material is formed on the base 21 made of the above-described material, and is patterned into a predetermined shape. Next, also as illustrated in FIG. 10A, the surface of the base 21 is coated with the material of the red filter 22R by spin coating or the like, and the material of the red filter 22R is patterned and fired by a photolithography technique to form the red filter 22R. Next, as in the case of the red filter 22R, the blue filter 22B and the green filter 22G are formed in order.

Figure 10B:
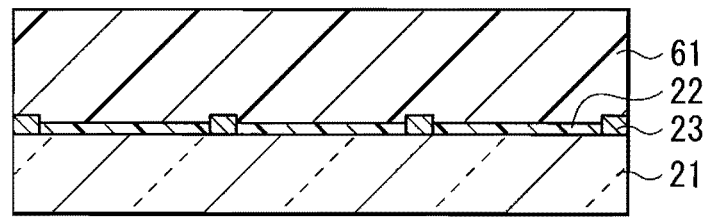

Next, as illustrated in FIG. 10B, the whole surface of the base 21 is coated with a resist (for example, a permanent resist usable as an optics application after being cured, such as SU-8) by spray coating or the like, and then the resist is prebaked at a given temperature to form a resist film 61 with a thickness of 50 μm to 150 μm both inclusive.

Figure 10C:
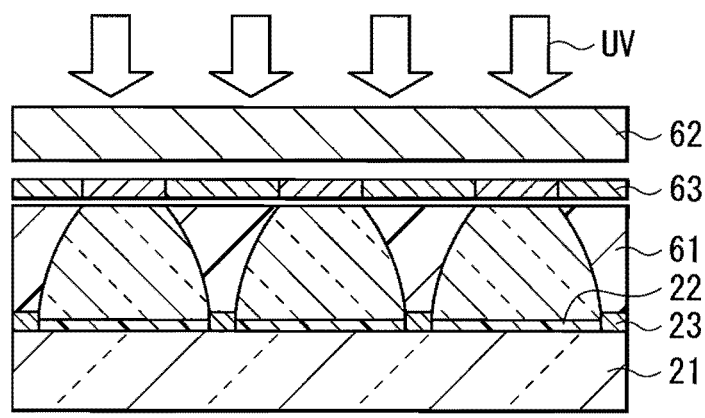
Figure 10D:
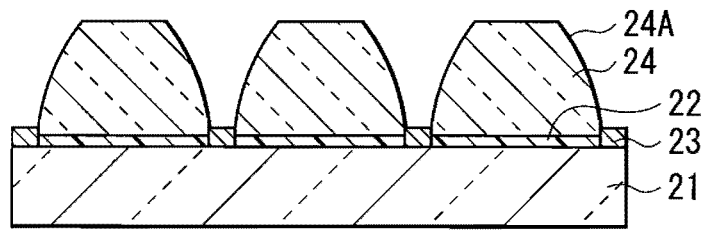

After that, as illustrated in FIG. 10C, ultraviolet light UV is applied to the resist from the surface side of the base 21 through a diffuser 62 and a mask 63. At this time, the base 21 and the mask 63 are correctly aligned, and are exposed to light. Next, as illustrated in FIG. 10D, the reflection elements 24 each having the side surface 24A with a parabolic curved shape are formed on the color filter 22 by development.

Figure 11:
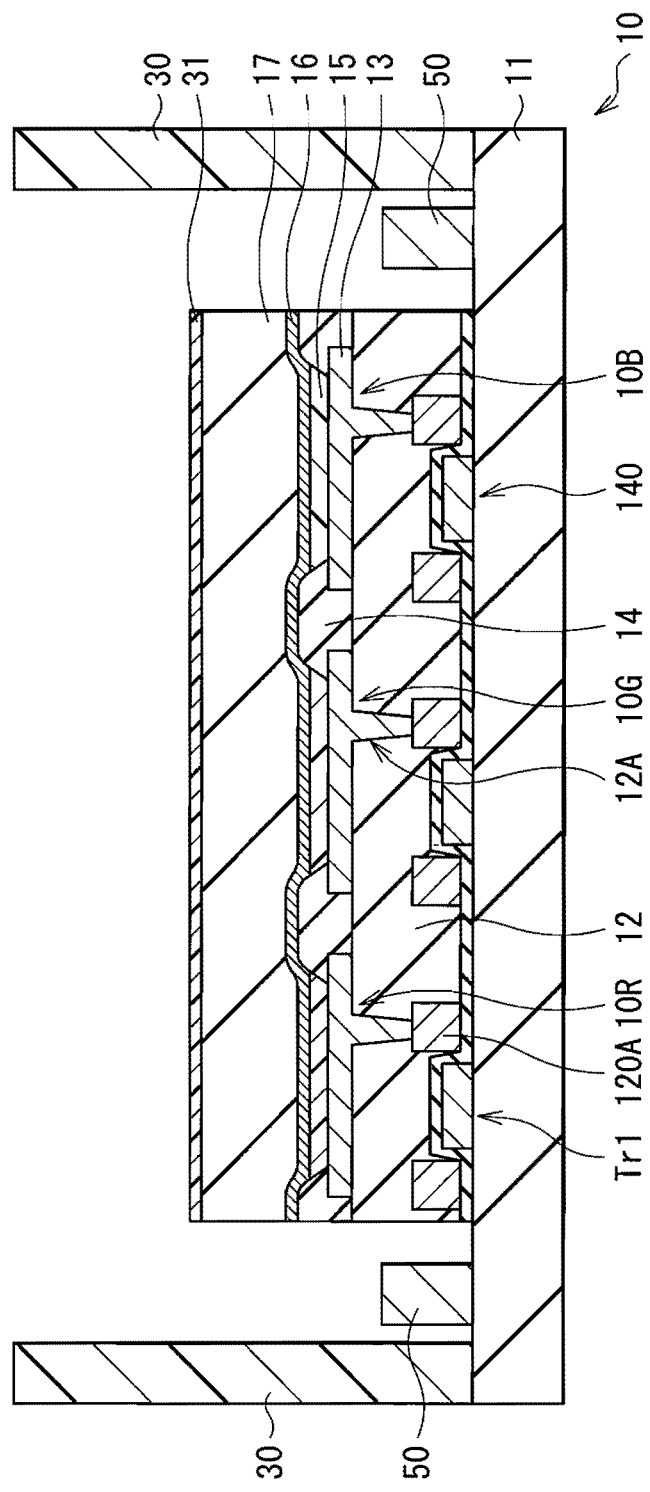
FIG. 11 is a sectional view illustrating steps following FIGS. 10A to 10D.
Figure 12:
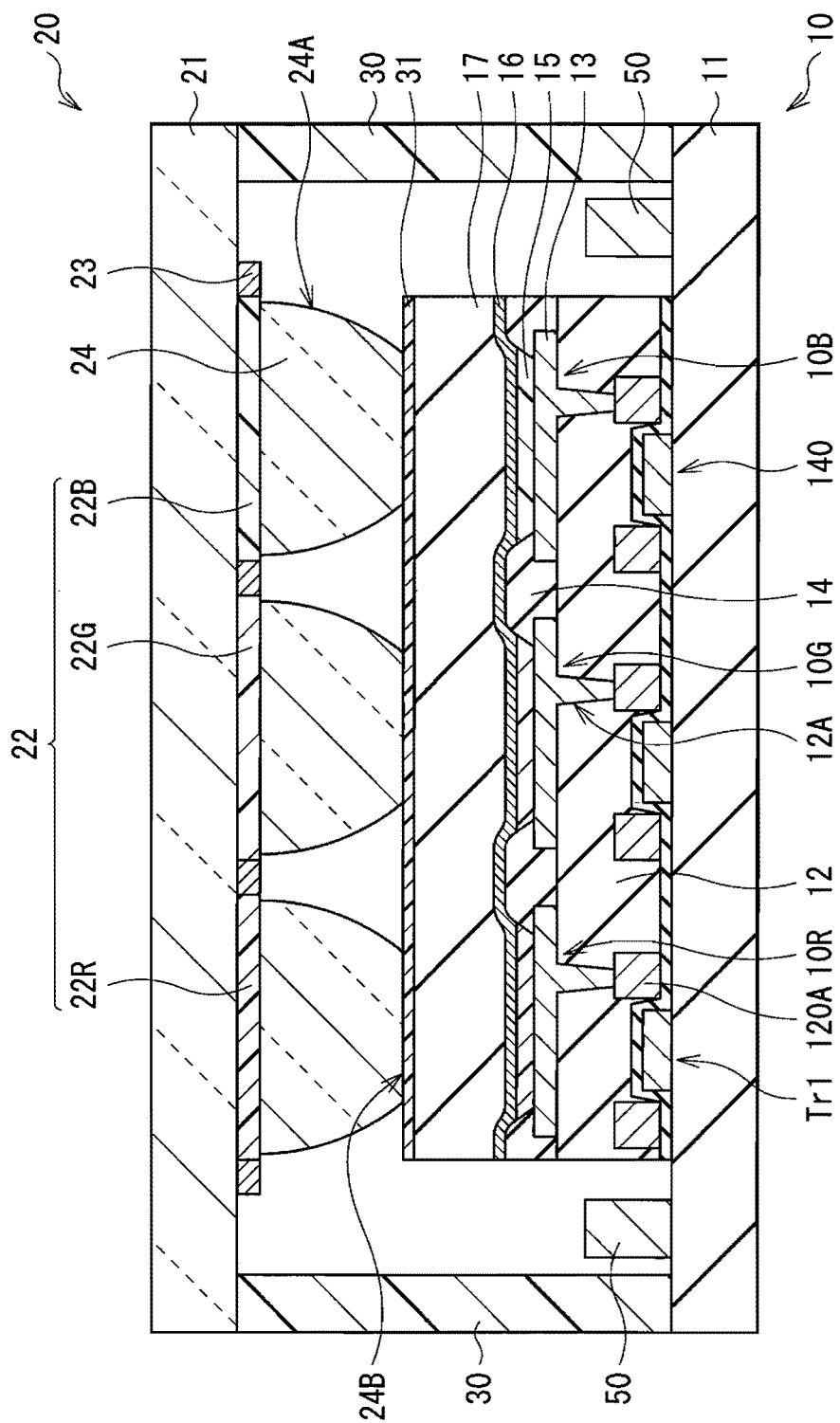
FIG. 12 is a sectional view illustrating a step following FIG. 11.
Figure 13:
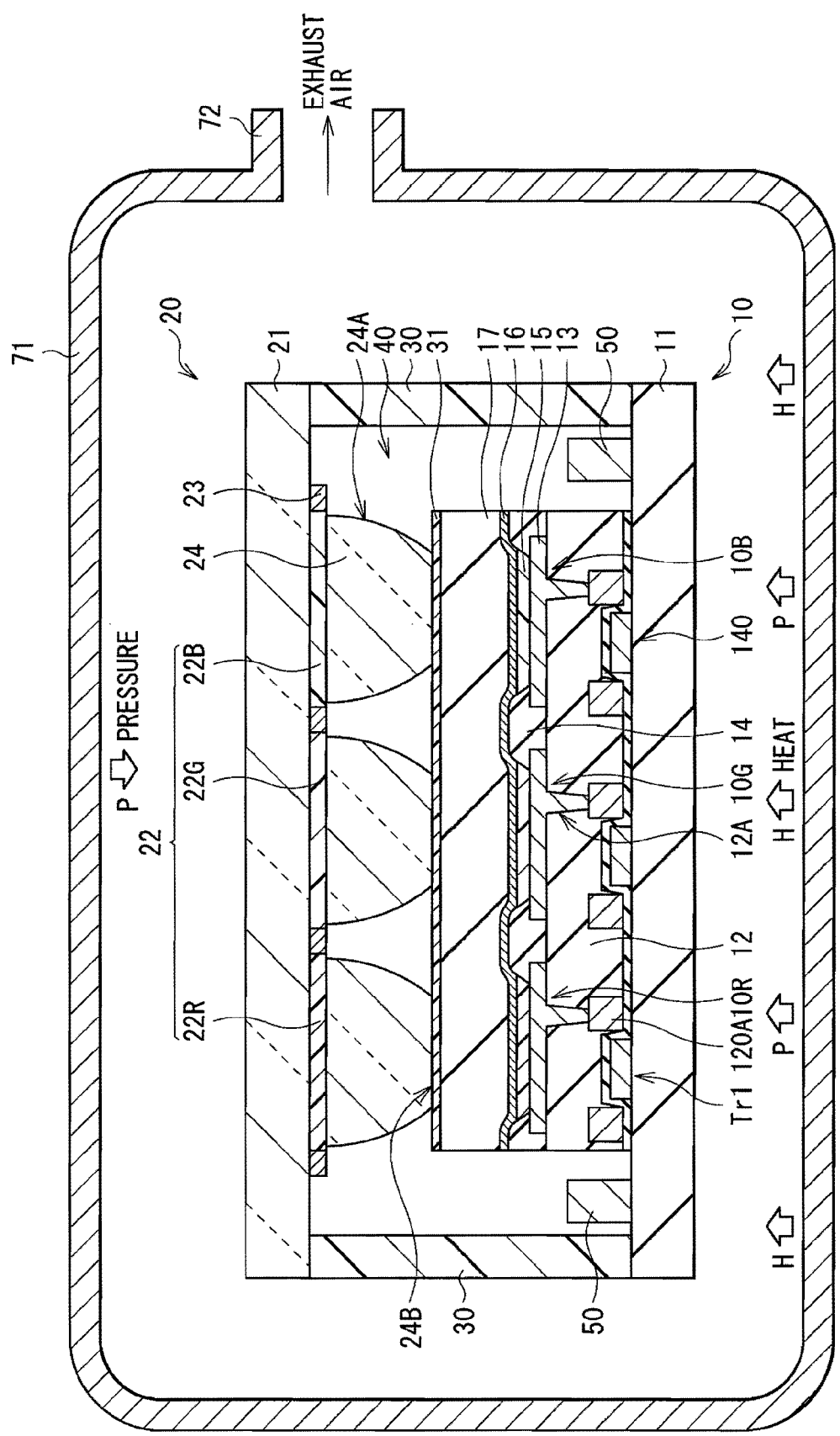
FIG. 13 is a sectional view illustrating a step following FIG. 12.

After the light-emitting panel 10 and the reflector 20 are formed, as illustrated in FIG. 11, the fixing layer 31 made of, for example, a heat-sensitive adhesive sheet is formed on the protective film 17 of the light-emitting panel 10, and the adhesive layer 30 is formed along the outer edge of the light-emitting panel 10. Moreover, the getters 50 with a sheet form, a paste form or the like are arranged between the display region 110 of the light-emitting panel 10 and the adhesive layer 30. Next, as illustrated in FIG. 12, the light-emitting panel 10 and the reflector 20 are aligned to overlap each other, and then as illustrated in FIG. 13, the light-emitting panel 10 and the reflector 20 are loaded in a vacuum chamber 71, and air in the vacuum chamber 71 is exhausted from an exhaust hole 72 to reduce the pressure inside the vacuum chamber 71, and then the light-emitting panel 10 and the reflector 20 are bonded together with the adhesive layer 30 by applying pressure and heat to the light-emitting panel 10 and the reflector 20 as illustrated by an arrow P and an arrow H, respectively, in a vacuum atmosphere. Thereby, the vacuum layer 40 is formed in a space between the light-emitting panel 10 and the reflector 20. Thus, the display illustrated in FIGS. 1 to 3 is completed.

In addition, to further improve air tightness, a wiring pattern for heating made of tungsten or the like is previously formed in an outer region of the light-emitting panel 10 by a lift-off method or evaporation, and the wiring pattern is glass-coated with low-melting glass (solder glass), and only the outer region of the light-emitting panel 10 may be locally heated by electrical conduction to be fit-sealed. Thereby, the possibility of damaging the organic light-emitting devices 10R, 10G and 10B is allowed to be reduced.

However, a method of bonding the light-emitting panel 10 and the reflector 20 together is not necessarily limited to these methods, and the light-emitting panel 10 and the reflector 20 may be bonded together without damage to the organic light-emitting devices 10R, 10G and 10B by using, for example, room-temperature bonding.

Figure 14:
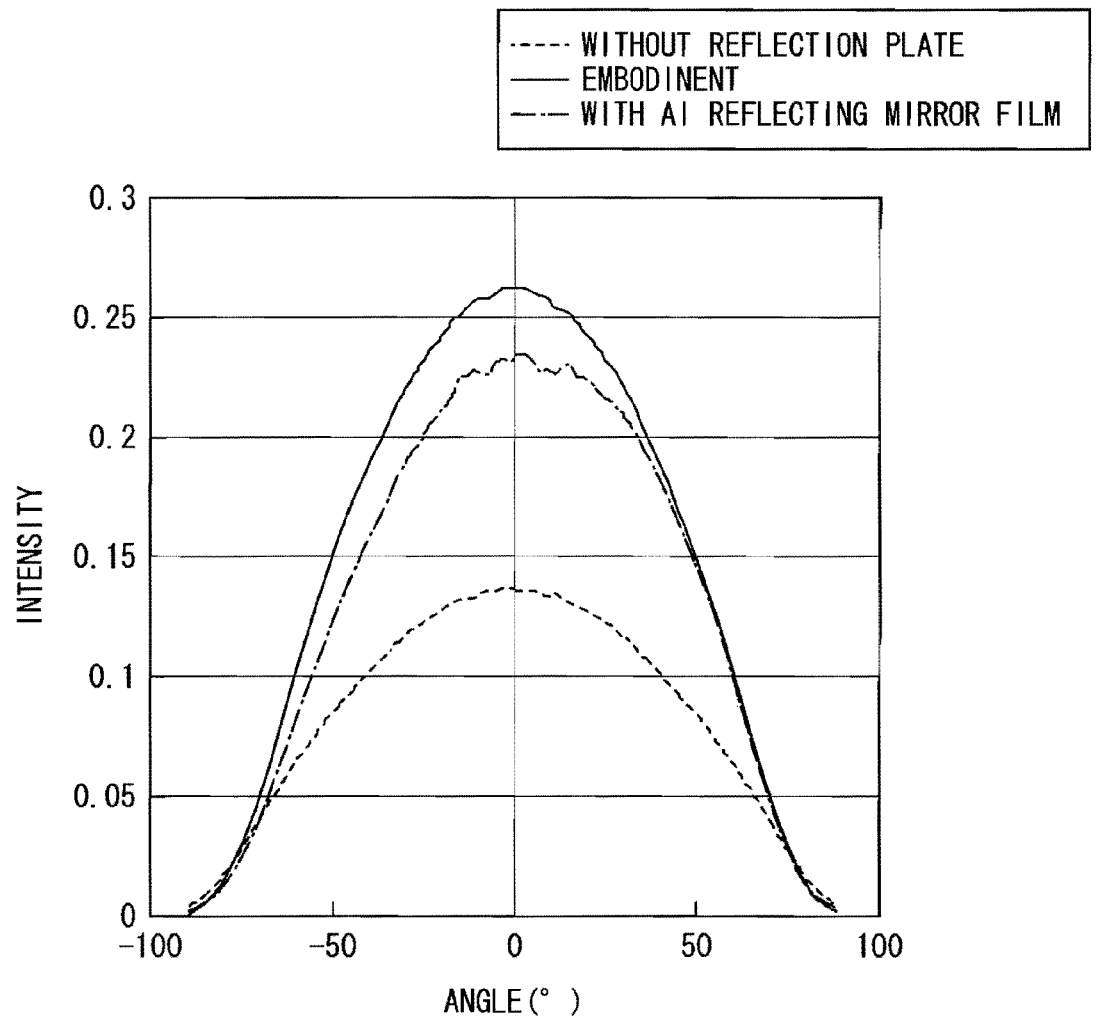
FIG. 14 is an illustration of a result of determining an emission angle distribution of the display illustrated in FIG. 3.

In addition, when the display was actually formed by the manufacturing method, and the obtained display lighted up to determine an emission angle distribution, it was confirmed as illustrated in FIG. 14 that compared to a configuration in related art in which an aluminum reflecting mirror film was formed on a side surface of a reflection element by evaporation, front intensity was improved by 11%, and energy efficiency was improved by 12%. It was because, for example, in the case where the configuration in related art in which the aluminum reflecting mirror film was formed by evaporation, reflectivity theoretically determined from the complex reflective index of aluminum and the reflective index of a material of the reflection element was approximately 90% at maximum, but the reflector 20 in the embodiment used total reflection at an interface between the side surface 24A of each reflection element 24 and the vacuum layer 40, thereby a light loss was zero.

In the display, a scanning signal is supplied from the scanning line drive circuit 130 to each pixel through a gate electrode of the writing transistor Tr2, and an image signal supplied from the signal line drive circuit 120 through the writing transistor Tr2 is retained in the retention capacitor Cs. In other words, on/off control of the driving transistor Tr1 is performed in response to the signal retained in the retention capacitor Cs, thereby a drive current Id is injected into each of the organic light-emitting devices 10R, 10G and 10B to emit light by the recombination of electrons and holes. The light passes through the second electrode 16, the color filter 22 and the transparent base 21 to be extracted.

In this case, a space between the light-emitting panel 10 and the reflector 20 is the vacuum layer 40, so light emitted from the organic light-emitting devices 10R, 10G and 10B on the light-emitting panel 10 enters into each reflection element 24 from the tip surface 24B thereof, and is reflected by the interface between the side surface 24A of each reflection element 24 and the vacuum layer 40 to be extracted to outside. When the shape of the side surface 24A of each reflection element 24 is adjusted so that the total reflection conditions are satisfied, light is allowed to be extracted by total reflection, and an improvement in light extraction efficiency and luminance is allowed. Moreover, a possibility that moisture or the like enters into the organic light-emitting devices 10R, 10G and 10B from a space between the light-emitting panel 10 and the reflector 20 is eliminated, and degradation in the organic light-emitting devices 10R, 10G and 10B due to the influence of moisture or the like is prevented.

Thus, in the method of manufacturing the display according to the embodiment, the adhesive layer 30 is formed along the outer edge of the light-emitting panel 10, and then the light-emitting panel 10 and the reflector 20 are bonded together with the adhesive layer 30 in a vacuum atmosphere, thereby the vacuum layer 40 is formed in a space between the light-emitting panel 10 and the reflector 20. Therefore, a complicated post-process for forming the reflecting mirror film is not necessary, and degradation in the organic light-emitting devices 10R, 10G and 10B is preventable.

In the display according to an embodiment, the space between the light-emitting panel 10 and the reflector 20 is the vacuum layer 40, so light emitted from the organic light-emitting devices 10R, 10G and 10B on the light-emitting panel 10 is allowed to be reflected by the interface between the side surface 24A of each reflection element 24 and the vacuum layer 40. Therefore, the complicated post-process for forming the reflecting mirror film is not necessary, and a possibility that moisture or the like enters into the organic light-emitting devices 10R, 10G and 10B from the space between the light-emitting panel 10 and the reflector 20 are preventable, and degradation in the organic light-emitting devices 10R, 10G and 10B is preventable.

MODULE AND APPLICATION EXAMPLES

Application examples of the display described in the above-described embodiment will be described below. The display according to the above-described embodiment is applicable to displays of electronic devices displaying a picture signal inputted from outside or a picture signal produced inside as an image or a picture in any fields, such as televisions, digital cameras, notebook personal computers, portable terminal devices such as cellular phones, and video cameras.

Modules

Figure 15:
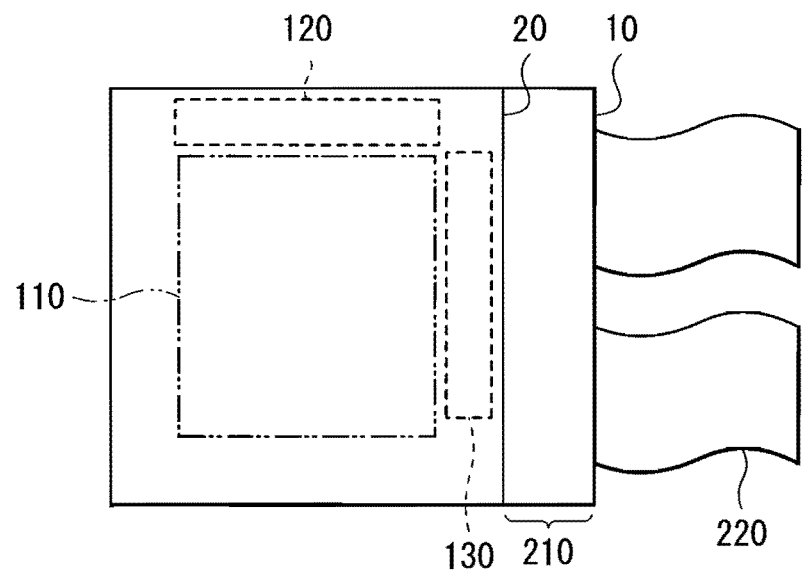
FIG. 15 is a schematic plan view of a module including the display according to the above-described embodiment.

The display according to the above-described embodiment is incorporated into various electronic devices such as Application Examples 1 to 5 which will be described later as a module as illustrated in FIG. 15. In the module, for example, a region 210 exposed from the reflector 20 and the adhesive layer 30 is arranged on a side of the substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1

Figure 16:
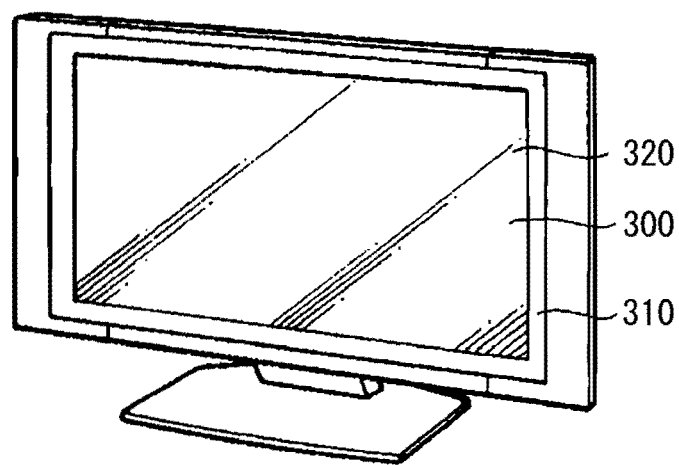
FIG. 16 is an external perspective view of Application Example 1 of the display according to the above-described embodiment.

FIG. 16 illustrates an appearance of a television to which the display according to the above-described embodiment is applied. The television has, for example, a picture display screen section 300 including a front panel 310 and a filter glass 320. The picture display screen section 300 is composed of the display according to the above-described embodiment.

Application Example 2

Figure 17A:
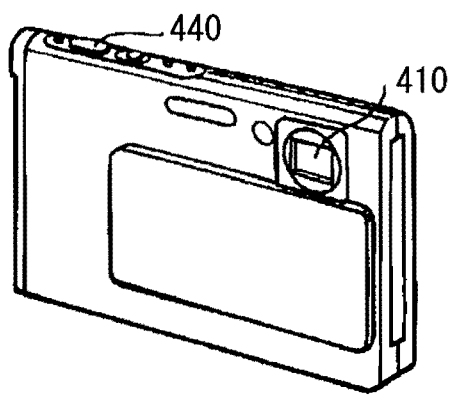
FIGS. 17A and 17B are an external perspective view from the front side of Application Example 2 and an external perspective view from the back side of Application Example 2, respectively.
Figure 17B:
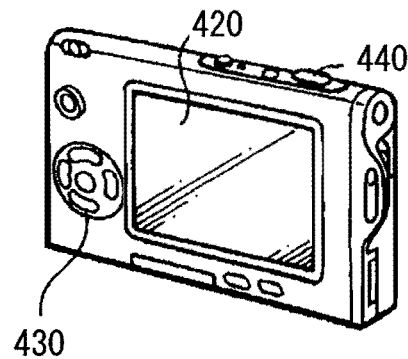

FIGS. 17A and 17B illustrate appearances of a digital camera to which the display according to the above-described embodiment is applied. The digital camera has, for example, a light-emitting section for a flash 410, a display section 420, a menu switch 430, and a shutter button 440. The display section 420 is composed of the display according to the above-described embodiment.

Application Example 3

Figure 18:
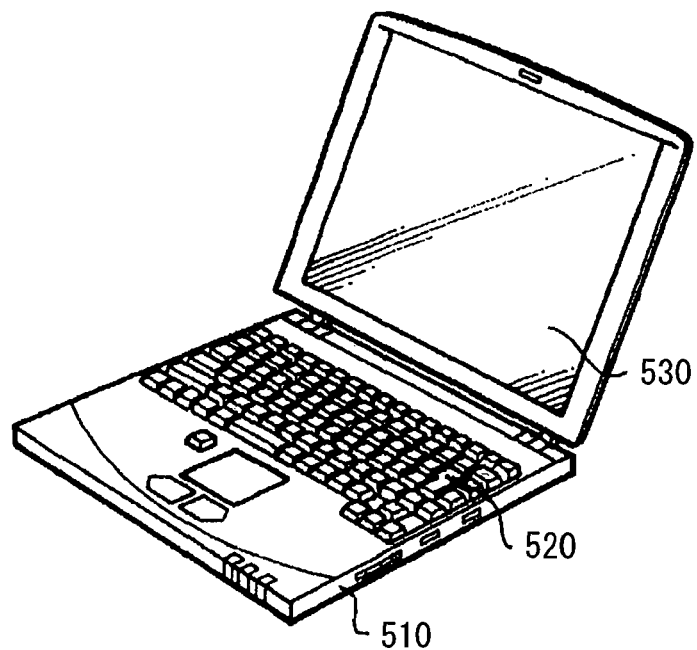
FIG. 18 is an external perspective view of Application Example 3.

FIG. 18 illustrates an appearance of a notebook personal computer to which the display according to the above-described embodiment is applied. The notebook personal computer has, for example, a main body 510, a keyboard 520 for operation of inputting characters and the like, a display section 530 for displaying an image. The display section 530 is composed of the display according to the above-described embodiment.

Application Example 4

Figure 19:
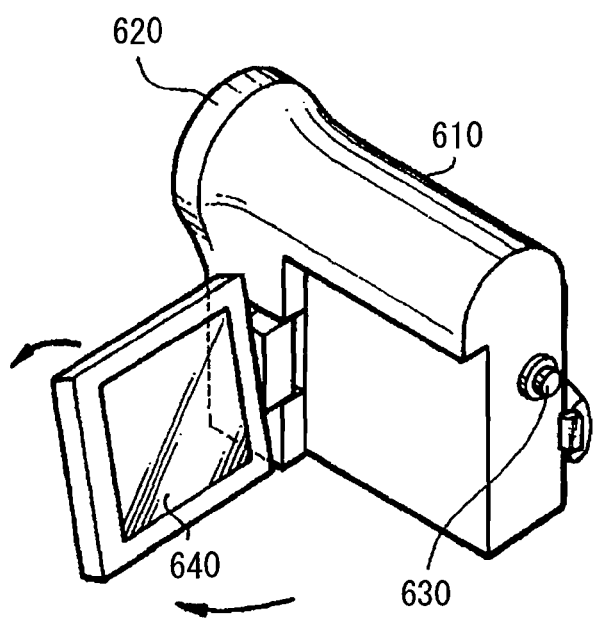
FIG. 19 is an external perspective view of Application Example 4.

FIG. 19 illustrates an appearance of a video camera to which the display according to the above-described embodiment is applied. The video camera has, for example, a main body 610, a lens for shooting an object 620 arranged on a front surface of the main body 610, a shooting start/stop switch 630, and a display section 640. The display section 640 is composed of the display according to the above-described embodiment.

Application Example 5

FIGS. 20A to 20G illustrate appearances of a cellular phone to which the display according to the above-described embodiment is applied. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 is composed of the display according to the above-described embodiment.

Although the present application is described referring to the embodiment, the present application is not limited thereto, and may be variously modified. For example, in the above-described embodiment, the case where a CF-integrated type in which the color filter 22 and the light-shielding film 23 are formed in the reflector 20 is described. However, the application is applicable to the case of a configuration without the color-filterless configuration in which the color filter 22 or the light-shielding film 23 is not arranged.

Moreover, for example, the material and thickness of each layer, the method and conditions of forming each layer are not limited to those described in the above-described embodiment, and each layer may be made of any other material with any other thickness by any other method under any other conditions. For example, the reflection elements 24 may be formed by not only lithography of the resist film 61 as described in the above-described embodiment, but also any other method such as laser processing or mold forming by using a machining-processed mold.

Further, in the above-described embodiment, the configurations of the organic light-emitting devices 10R, 10B and 10G are specifically described. However, all layers are not necessarily included, or any other layer may be further included.

In addition, the display of the application is applicable to any light-emitting device for any purpose other than display, such as a lighting device.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method of manufacturing a display comprising:
    forming a plurality of organic light-emitting devices in a display region on a substrate to form a light-emitting panel;
    forming projection-shaped reflection elements corresponding to the plurality of organic light-emitting devices, respectively, on a base to form a reflector, wherein for each reflection element a color filter is formed between the base and the light output side of the reflection element, wherein the reflection elements are separated from one another in a plan view on a light output side of the reflection element by a distance greater than widths of light blocking members that are alternately arranged with the reflection elements;
    forming an adhesive layer along an outer edge of the substrate of the light-emitting panel; and
    bonding the light-emitting panel and the reflector together with the adhesive layer in a vacuum atmosphere such that the adhesive layer, the substrate of the light-emitting panel, and the base of the reflector encase the organic light-emitting devices and the reflection elements, thereby to form a vacuum layer in a space between the light-emitting panel, the adhesive layer, and the reflector, wherein a thickness of the adhesive layer corresponds to a thickness of the vacuum layer.

2. The method of manufacturing a display according to claim 1, wherein
    in the step of forming the adhesive layer, a getter is arranged outside of the display region of the light-emitting panel, and then the adhesive layer is formed outside of the getter.

3. The method of manufacturing a display according to claim 1, wherein a fixing layer is formed between the reflector elements and the light-emitting panel.

4. A display comprising:
    a light-emitting panel including a plurality of organic light-emitting devices in a display region on a substrate;
    a reflector including projection-shaped reflection elements corresponding to the plurality of organic light-emitting devices, respectively on a base, wherein for each reflection element a color filter is formed between the base and the light output side of the reflection element, wherein the reflection elements are separated from one another in a plan view on a light output side of the reflection element by a distance greater than widths of light blocking members that are alternately arranged with the reflection elements;

an adhesive layer formed along an outer edge of the substrate of the light-emitting panel so as to bond the light-emitting panel and the reflector together such that the adhesive layer, the substrate of the light-emitting panel, and the base of the reflector encase the organic light-emitting devices and the reflection elements; and a vacuum layer formed in a space between the light-emitting panel, the adhesive layer, and the reflector, wherein a thickness of the adhesive layer corresponds to a thickness of the vacuum layer.

5. The display according to claim 4, wherein
in the reflector, light emitted from the plurality of organic light-emitting devices is reflected by an interface between a side surface of each of the reflection elements and the vacuum layer.

6. The display according to claim 4, wherein
a getter is arranged between the display region of the light-emitting panel and the adhesive layer.

7. The display according to claim 4, wherein
a getter is arranged between the display region of the light-emitting panel and the adhesive layer.

8. The display according to claim 4, wherein a fixing layer is formed between the reflector elements and the light-emitting panel.

* * * * *